(12) United States Patent
Raring

(10) Patent No.: US 8,242,522 B1
(45) Date of Patent: Aug. 14, 2012

(54) OPTICAL DEVICE STRUCTURE USING NON-POLAR GAN SUBSTRATES AND GROWTH STRUCTURES FOR LASER APPLICATIONS IN 481 NM

(75) Inventor: James W. Raring, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 99 days.

(21) Appl. No.: 12/778,718

(22) Filed: May 12, 2010

Related U.S. Application Data

(60) Provisional application No. 61/177,317, filed on May 12, 2009.

(51) Int. Cl.
*H01L 33/00* (2010.01)
*H01L 29/06* (2006.01)
*H01L 31/00* (2006.01)

(52) U.S. Cl. ............. 257/96; 257/13; 257/14; 257/15; 257/94; 257/97; 257/E33.012; 257/E33.034

(58) Field of Classification Search .................. None
See application file for complete search history.

(56) References Cited

U.S. PATENT DOCUMENTS

| | | | |
|---|---|---|---|
| 4,341,592 A | 7/1982 | Shortes et al. |
| 4,860,687 A | 8/1989 | Frijlink |
| 5,334,277 A | 8/1994 | Nakamura |
| 5,366,953 A | 11/1994 | Char et al. |
| 5,527,417 A | 6/1996 | Lida et al. |
| 5,607,899 A | 3/1997 | Yoshida et al. |
| 5,632,812 A | 5/1997 | Hirabayashi |
| 5,696,389 A | 12/1997 | Ishikawa et al. |
| 5,821,555 A | 10/1998 | Saito et al. |
| 5,888,907 A | 3/1999 | Tomoyasu et al. |
| 5,926,493 A | 7/1999 | O'Brien et al. |
| 6,069,394 A | 5/2000 | Hashimoto et al. |
| 6,147,953 A | 11/2000 | Duncan |
| 6,153,010 A | 11/2000 | Kiyoku et al. |
| 6,379,985 B1 | 4/2002 | Cervantes et al. |
| 6,451,157 B1 | 9/2002 | Hubacek |
| 6,586,762 B2 | 7/2003 | Kozaki |

(Continued)

FOREIGN PATENT DOCUMENTS

JP  2007-173467 A  7/2007

(Continued)

OTHER PUBLICATIONS

Okamoto et al. in "High-Efficiency Continuous-Wave Operation of Blue-Green Laser Diodes Based on Nonpolar m-Plane Gallium Nitride", Jun. 20, 2008, The Japan Society of Applied Physics, Applied Physics Express 1 (2008) 072201.*

(Continued)

*Primary Examiner* — Nathan Ha
*Assistant Examiner* — Michael Jung
(74) *Attorney, Agent, or Firm* — Kilpatrick Townsend & Stockton LLP

(57) ABSTRACT

An optical device. The optical device comprises a GaN substrate having a non-polar surface region, an n-type GaN cladding layer, an n-type SCH layer comprised of InGaN, a multiple quantum-well active region comprised of five InGaN quantum well layers separated by four InGaN barrier layers, a p-type guide layer comprised of GaN, an electron blocking layer comprised of AlGaN, a p-type GaN cladding layer, and a p-type GaN contact layer.

1 Claim, 3 Drawing Sheets

Index and Simulated Optical Mode Profile

U.S. PATENT DOCUMENTS

| | | |
|---|---|---|
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,814,811 B2 | 11/2004 | Ose |
| 6,833,564 B2 | 12/2004 | Shen et al. |
| 6,858,081 B2 | 2/2005 | Biwa et al. |
| 6,920,166 B2 | 7/2005 | Akasaka et al. |
| 7,053,413 B2 | 5/2006 | D'Evelyn et al. |
| 7,063,741 B2 | 6/2006 | D'Evelyn |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,390,359 B2 | 6/2008 | Miyanaga et al. |
| 7,470,555 B2 | 12/2008 | Matsumura |
| 7,489,441 B2 | 2/2009 | Scheible et al. |
| 7,555,025 B2 | 6/2009 | Yoshida |
| 7,727,332 B2 | 6/2010 | Habel et al. |
| 7,749,326 B2 | 7/2010 | Kim et al. |
| 7,806,078 B2 | 10/2010 | Yoshida |
| 7,968,864 B2 | 6/2011 | Akita et al. |
| 8,017,932 B2 | 9/2011 | Okamoto et al. |
| 2002/0050488 A1 | 5/2002 | Nikitin et al. |
| 2002/0085603 A1 | 7/2002 | Okumura |
| 2003/0000453 A1 | 1/2003 | Unno et al. |
| 2003/0001238 A1 | 1/2003 | Ban |
| 2003/0012243 A1* | 1/2003 | Okumura ............ 372/46 |
| 2003/0020087 A1 | 1/2003 | Goto et al. |
| 2003/0140846 A1 | 7/2003 | Biwa et al. |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0151222 A1 | 8/2004 | Sekine |
| 2004/0196877 A1 | 10/2004 | Kawakami et al. |
| 2005/0040384 A1* | 2/2005 | Tanaka et al. ............ 257/13 |
| 2005/0072986 A1 | 4/2005 | Sasaoka |
| 2005/0168564 A1 | 8/2005 | Kawaguchi et al. |
| 2005/0224826 A1 | 10/2005 | Keuper et al. |
| 2005/0229855 A1 | 10/2005 | Raaijmakers |
| 2006/0037529 A1 | 2/2006 | D'Evelyn |
| 2006/0060131 A1 | 3/2006 | Atanackovic |
| 2006/0078022 A1* | 4/2006 | Kozaki et al. ............ 372/43.01 |
| 2006/0079082 A1 | 4/2006 | Bruhns et al. |
| 2006/0086319 A1 | 4/2006 | Kasai et al. |
| 2006/0118799 A1 | 6/2006 | D'Evelyn et al. |
| 2006/0144334 A1 | 7/2006 | Yim et al. |
| 2006/0189098 A1 | 8/2006 | Edmond |
| 2006/0193359 A1 | 8/2006 | Kuramoto |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0110112 A1 | 5/2007 | Sugiura |
| 2007/0217462 A1 | 9/2007 | Yamasaki |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0124817 A1 | 5/2008 | Bour et al. |
| 2008/0164578 A1 | 7/2008 | Tanikella et al. |
| 2008/0173735 A1 | 7/2008 | Mitrovic et al. |
| 2008/0191192 A1 | 8/2008 | Feezle et al. |
| 2008/0191223 A1 | 8/2008 | Nakamura et al. |
| 2008/0217745 A1 | 9/2008 | Miyanaga et al. |
| 2008/0232416 A1 | 9/2008 | Okamoto et al. |
| 2008/0285609 A1* | 11/2008 | Ohta et al. ............ 372/44.011 |
| 2008/0291961 A1 | 11/2008 | Kamikawa et al. |
| 2008/0303033 A1 | 12/2008 | Brandes |
| 2008/0315179 A1* | 12/2008 | Kim et al. ............ 257/13 |
| 2009/0058532 A1 | 3/2009 | Kikkawa et al. |
| 2009/0078944 A1 | 3/2009 | Kubota et al. |
| 2009/0081857 A1 | 3/2009 | Hanser et al. |
| 2009/0141765 A1 | 6/2009 | Kohda et al. |
| 2009/0159869 A1 | 6/2009 | Ponce et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0320744 A1 | 12/2009 | D'Evelyn |
| 2010/0001300 A1 | 1/2010 | Raring et al. |
| 2010/0003492 A1 | 1/2010 | D'Evelyn |
| 2010/0006873 A1 | 1/2010 | Raring et al. |
| 2010/0025656 A1 | 2/2010 | Raring et al. |
| 2010/0031875 A1 | 2/2010 | D'Evelyn |
| 2010/0096615 A1* | 4/2010 | Okamoto et al. ............ 257/13 |
| 2010/0140745 A1 | 6/2010 | Khan et al. |
| 2010/0151194 A1 | 6/2010 | D'Evelyn |
| 2010/0295054 A1 | 11/2010 | Okamoto et al. |
| 2010/0302464 A1 | 12/2010 | Raring |
| 2010/0316075 A1 | 12/2010 | Raring et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0103418 A1 | 5/2011 | Hardy et al. |
| 2011/0180781 A1 | 7/2011 | Raring et al. |
| 2011/0186874 A1 | 8/2011 | Shum |
| 2011/0186887 A1 | 8/2011 | Trottier et al. |
| 2011/0247556 A1 | 10/2011 | Raring |

FOREIGN PATENT DOCUMENTS

| | | | |
|---|---|---|---|
| WO | WO 2008/041521 | * | 4/2008 |

OTHER PUBLICATIONS

Aoki et al., "InGaAs/InGaAsP MQW Electroabsorption Modulator Integrated with a DFB Laser Fabricated by Band-Gap Energy Control Selective Area MOCVD, 1993, " IEEE J Quantum Electronics, vol. 29, pp. 2088-2096.

Asano et al., "100-mW kink-Free Blue-Violet Laser Diodes with Low Aspect Ratio," 2003, IEEE Journal of Quantum Electronics, vol. 39, No. 1, pp. 135-140.

Bernardini et al., "Spontaneous Polarization and Piezoelectric Constants of III-V Nitrides," 1997, Physical Review B, vol. 56, No. 16, pp. 10024-10027.

Caneau et al., "Studies on Selective OMVPE of (Ga,In)/(As,P)," 1992, Journal of Crystal Growth, vol. 124, pp. 243-248.

Chen et al., "Growth and Optical Properties of Highly Uniform and Periodic InGaN Nanostructures," 2007, Advanced Materials, vol. 19, pp. 1707-1710.

D'Evelyn et al., "Bulk GaN Crystal Growth by the High-Pressure Ammonothermal Method," Journal of Crystal Growth, 2007, vol. 300, pp. 11-16.

Fujii et al., "Increase in the Extraction Efficiency of GaN-based Light-Emitting Diodes Via Surface Roughening," 2004, Applied Physics Letters, vol. 84, No. 6, pp. 855-857.

Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.

Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.

Gardner et al. "Blue-emitting InGaN-GaN double-heterostructure light-emitting diodes reaching maximum quantum efficiency above 200 A/ cm2", Applied Physics Letters 91, 243506 (2007).

hap ://techon.nikkeibp. co jp/english/NEWS_EN/20080122/146009.

Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kendall et al., "Energy Savings Potential of Solid State Lighting in General Lighting Applications," 2001, Report for the Department of Energy, pp. 1-35.

Kim et al, "Improved Electroluminescence on Nonpolar m-plane InGaN/GaN Qantum Well LEDs", 2007, Physics Status Solidi (RRL), vol. 1, No. 3, pp. 125-127.

Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.

Masui et al. "Electrical Characteristics of Nonpolar InGaN-Based Light-Emitting Diodes Evaluated at Low Temperature," Jpn. J. Appl. Phys. 46 pp. 7309-7310 (2007).

Michiue et al. "Recent development of nitride LEDs and LDs," Proceedings of SPIE, vol. 7216, 72161Z (2009).

Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.

Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.

Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.

Okamoto et. al "Continuous-Wave Operation of m-Plane InGaN Multiple Quantum Well Laser Diodes" The Japan Society of | Applied Physics JJAP Express LEtter, vol. 46, No. 9, 2007 pp. L 187-L 189.

Purvis, "Changing the Crystal Face of Gallium Nitride." The Advance Semiconductor Magazine, vol. 18, No. 8, Nov. 2005.

Sato et al., "High Power and High Efficiency Green Light Emitting Diode on free-Standing Semipolar (1122) Bulk GaN Substrate," 2007 Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-plane InGaN/GaN Laser Diodes," 2007, Journal of Japanese Applied Physics, vol. 46, No. 9, pp. 190-191.

Schmidt et al., "High Power and High External Efficiency m-plane InGaN Light Emitting Diodes," 2007, Japanese Journal of Applied Physics, vol. 46, No. 7, pp. L126-L128.

Shchekin et al., "High Performance Thin-film Flip-Chip InGaN-GaN Light-emitting Diodes," 2006, Applied Physics Letters, vol. 89, pp. 071109-071109-3.

Shen et al. "Auger recombination in InGaN measured by photoluminescence," Applied Physics Letters, 91, 141101 (2007).

Sizov et al., "500-nm Optical Gain Anisotropy of Semipolar (1122) InGaN Quantum Wells," 2009, Applied Physics Express, vol. 2, pp. 071001-1-071001-3.

Tomiya et. al. Dislocation related issues in the degradation of GaN-based laser diodes, IEEE Journal of Selected Topics in Quantum Electronics vol. 10, No. 6 (2004).

Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.

Uchida et al.,"Recent Progress in High-Power Blue-violet Lasers," 2003, IEEE Journal of Selected Topics in Quantum Electronics, vol. 9, No. 5, pp. 1252-1259.

Waltereit et al., "Nitride Semiconductors Free of Electrostatic Fields for Efficient White Light-emitting Diodes," 2000, Nature: International Weekly Journal of Science, vol. 406, pp. 865-868.

Wierer et al., "High-power AlGaInN Flip-chip Light-emitting Diodes," 2001, Applied Physics Letters, vol. 78, No. 22, pp. 3379-3381.

Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.

Yoshizumi et al. "Continuous-Wave operation of 520 nm Green InGaN-Based Laser Diodes on Semi-Polar {20-21} GaN Substrates," Applied Physics Express 2 (2009).—1310 1410.

Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

Office action for U.S. Appl. No. 12/573,820 (Oct. 11, 2011).
Office action for U.S. Appl. No. 12/749,466 (Feb. 3, 2012).
Office action for U.S. Appl. No. 13/046,565 (Feb. 2, 2012).
Office action for U.S. Appl. No. 13/046,565 (Nov. 7, 2011).
Office action for U.S. Appl. No. 12/484,924 (Oct. 31, 2011).
Office action for U.S. Appl. No. 12/497,289 (Feb. 2, 2012).
Office action for U.S. Appl. No. 12/759,273 (Nov. 21, 2011).
Office action for U.S. Appl. No. 12/762,269 (Oct. 12, 2011).
Office action for U.S. Appl. No. 12/762,271 (Dec. 23, 2011).
Office action for U.S. Appl. No. 12/778,718 (Nov. 25, 2011).
Notice of Allowance for U.S. Appl. No. 12/762,278 (Nov. 7, 2011).

Abare "Cleaved and Etched Facet Nitride Laser Diodes," IEEE Journal of Selected Topics in Quantum Electronics, vol. 4, No. 3, pp. 505-509 (May 1998).

Asif Khan "Cleaved cavity optically pumped InGaN-GaN laser grown on spinel substrates," Appl. Phys. Lett. 69 (16), pp. 2418-2420 (Oct. 14, 1996).

Feezell, Daniel et al.; "Short-Wave Diode Lasers: Nonpolar gallium nitride laser diodes are the next new blue"; *Laser Focus World*; Oct. 1, 2007; vol. 43, Issue 10 Retrieved from the Internet: <URL: http://www.laserfocusworld.com/content/lfw/en/articles/print/volume-43/issue-10/features/short-wave-diode-lasers-nonpolar-gallium-nitride-laser-diodes-are-the-next-new-blue.html >.

Lin et al."Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).

Park, "Crystal orientation effects on electronic properties of wurtzite InGaN/GaN quantum wells,",Journal of Applied Physics vol. 91, No. 12, pp. 9904-9908 (Jun. 2002).

Romanov "Strain-induced polarization in wurtzite III-nitride semipolar layers," Journal of Applied Physics 100, pp. 023522-1 through 023522-10 (Jul. 25, 2006).

Schoedl "Facet degradation of GaN heterostructure laser diodes," Journal of Applied Physics vol. 97, issue 12, pp. 123102-1 to 123102-8 (2005).

* cited by examiner

CW Ridge LD Results
- 25°C continuous wave testing of 1200μm x 1.6mm laser with 80%/99% facet coatings
- Lasing Spectra
  - Shift from 474nm to 481 nm with increased current CW Ridge LD Results
- 25°C continuous wave testing of 1200μm x 1.6mm laser with 80%/99% facet coatings
- Light versus current and voltage
  - $J_{th}$ ~3.1 kA/cm$^2$, $V_{th}$ ~8.8V
  - +60mW power

OPTICAL DEVICE STRUCTURE USING NON-POLAR GAN SUBSTRATES AND GROWTH STRUCTURES FOR LASER APPLICATIONS IN 481 NM

CROSS-REFERENCE TO RELATED APPLICATION

This application claims priority to U.S. Ser. No. 61/177,317, filed May 12, 2009; which is commonly assigned and hereby incorporated by reference.

BACKGROUND OF THE INVENTION

This invention is directed to optical devices and related methods. More particularly, the invention provides a method and device for emitting electromagnetic radiation using non-polar gallium containing substrates, such as GaN, MN, InN, InGaN, AlGaN, and AlInGaN, and others. By way of example, the invention can be applied to optical devices, lasers, light emitting diodes, solar cells, photoelectrochemical water splitting and hydrogen generation, photodetectors, integrated circuits, and transistors, among other devices.

In the late 1800's, Thomas Edison invented the light bulb. The conventional light bulb, commonly called the "Edison bulb," has been used for over one hundred years for a variety of applications, including lighting and displays. The conventional light bulb uses a tungsten filament enclosed in a glass bulb sealed in a base, which is screwed into a socket. The socket is coupled to an AC power or DC power source. Such light bulbs can be found commonly in houses, buildings, and outdoor lighting displays, as well as elsewhere.

Unfortunately, there are several disadvantages to the conventional Edison light bulb. First, the conventional light bulb dissipates considerable energy as thermal energy. More than 90% of the energy used for the conventional light bulb is lost as thermal energy. Secondly, reliability is a concern. The conventional light bulb routinely fails from thermal expansion and contraction of the filament element. Furthermore, light bulbs emit light over a broad spectrum, much of which does not result in bright illumination due to the spectral sensitivity of the human eye. Another disadvantage is that light bulbs emit light in all directions. Therefore they are not ideal for applications requiring directionality or focus, such as projection displays, optical data storage, or specialized directed lighting.

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas Argon ion laser. The Ar-ion laser utilized a noble gas as the active medium and produced laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%. In addition, the size, weight, and cost of the lasers were undesirable.

As laser technology evolved, more efficient lamp pumped solid state laser designs were developed for the red and infrared wavelengths, but these technologies remained a challenge for blue and green lasers. As a result, lamp pumped solid state lasers were developed in the infrared, with the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers are now widely utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm light. The DPSS laser technology extended the life and improved the wall plug efficiency of the LPSS lasers to 5-10%. Further commercialization resulted in more high end specialty industrial, medical, and scientific applications. The change to diode pumping, however, increases the system cost and requires precise temperature control. The resulting laser is large, consumes substantial power, yet does not address the energy storage properties which make the lasers difficult to modulate at high speeds.

As high power laser diodes evolved and new specialty SHG crystals were developed, it became possible to directly convert the output of the infrared diode laser to provide blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs improve the efficiency, cost and size compared to DPSS—SHG lasers, but the specialty diodes and crystals required make this challenging today. Additionally, while the diode-SHG lasers have the benefit of being directly modulated, they suffer from sensitivity to temperature, limiting their application.

BRIEF SUMMARY OF THE INVENTION

According to the present invention, techniques related generally to optical devices are provided. More particularly, the present invention provides a method and device for emitting electromagnetic radiation using non-polar gallium containing substrates, such as GaN, MN, InN, InGaN, AlGaN, and AlInGaN, and others. The invention can be applied to optical devices, lasers, light emitting diodes, solar cells, photoelectrochemical water splitting and hydrogen generation, photodetectors, integrated circuits, and transistors, among other devices.

In a specific embodiment, the present invention provides an optical device. The optical device has a gallium nitride substrate member having a non-polar crystalline surface region. The device has an n-type GaN cladding layer overlying the surface region. The n-type GaN cladding layer preferably has a thickness from 100 nm to 3000 nm, with a silicon doping level of 5E17 to 3E18 cm-3. In a specific embodiment, the device has an n-side SCH layer overlying the n-type GaN cladding layer. Preferably, the n-side SCH layer is comprised of InGaN with a molar fraction of indium of between 4% and 6% and has a thickness from 45 to 60 nm. The device also has a multiple quantum well active region overlying the n-side SCH layer. In a preferred embodiment, the multiple quantum well active region is comprised of five 4.5-5.5 nm InGaN quantum wells separated by four 9.5-10.5 nm InGaN barriers with an indium molar fraction of between 1.5% and 3%. The optical device also has a p-side guide layer overlying the multiple quantum well active region. The p-side guide layer is comprised of GaN with molar a thickness from 10 nm to 20 nm. The device also has an electron blocking layer overlying the p-side guide layer. In a preferred embodiment, the p-side guide layer is comprised of AlGaN with molar fraction of aluminum of between 15% and 22% and has a thickness from 10 nm to 15 nm and doped with magnesium. The device further has a p-GaN cladding layer overlying the electron blocking layer. The p-GaN cladding layer has a thickness from 400 nm to 1000 nm with Mg doping level of 5E17 cm-3 to 1E19 cm-3. In a specific embodiment, the device has a p++-GaN contact layer overlying the p-GaN cladding layer. The p++-gaN contact layer has a thickness from 20 nm to 40 nm with a magnesium doping level of 1E20 cm-3 to 1E21 cm-3.

The present invention enables a cost-effective optical device for laser applications. In a specific embodiment, the optical device can be manufactured in a relatively simple and cost effective manner. Depending upon the embodiment, the present apparatus and method can be manufactured using conventional materials and/or methods. The present laser device uses a non-polar gallium nitride material capable of achieving a 481 nm light. These and other benefits may be described throughout the present specification and more particularly below by reference to the specification and attached drawings.

DETAILED DESCRIPTION OF THE INVENTION

According to the present invention, techniques related generally to optical devices are provided. More particularly, the present invention provides a method and device for emitting electromagnetic radiation using non-polar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices. In a specific embodiment, the present laser device can be employed in a non-polar gallium containing substrate, as described below.

Figure 1:
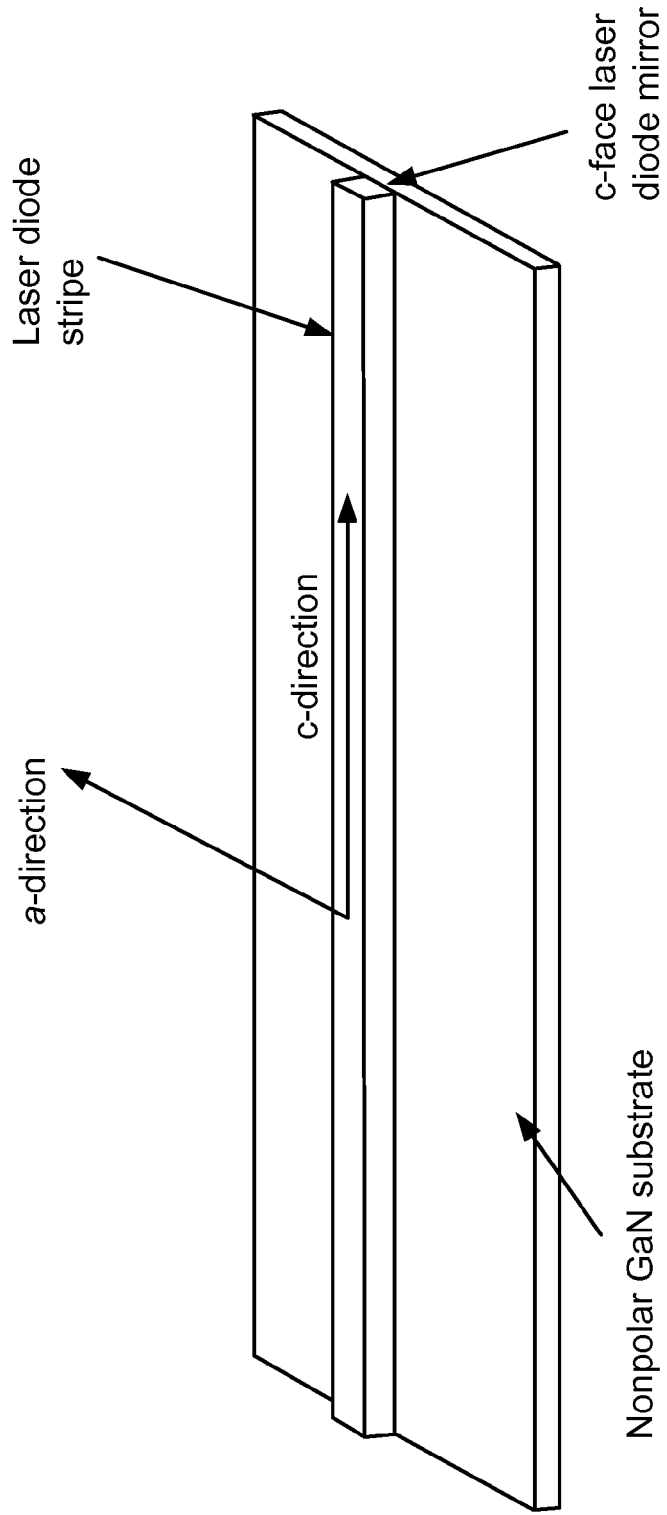
FIG. 1 is a simplified perspective view of a laser device fabricated on a non-polar substrate according to an embodiment of the present invention.

FIG. 1 is a simplified perspective view of a laser device fabricated on a non-polar substrate according to an embodiment of the present invention. This diagram is merely an example, which should not unduly limit the scope of the claims herein. One of ordinary skill in the art would recognize other variations, modifications, and alternatives. As shown, the optical device includes a gallium nitride substrate member having a non-polar crystalline surface region. In a specific embodiment, the gallium nitride substrate member is a bulk GaN substrate characterized by having a non-polar crystalline surface region, but can be others. In a specific embodiment, the bulk nitride GaN substrate comprises nitrogen and has a surface dislocation density below $10^5$ cm$^{-2}$. The nitride crystal or wafer may comprise $Al_xIn_yGa_{1-x-y}N$, where $0 \leq x, y, x+y \leq 1$. In one specific embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface. As a consequence of the orthogonal or oblique orientation of the dislocations, the surface dislocation density is below about $10^5$ cm$^{-2}$.

In a specific embodiment on non-polar GaN, the device has a laser stripe region formed overlying a portion of the non-polar crystalline orientation surface region. In a specific embodiment, the laser stripe region is characterized by a cavity orientation is substantially parallel to the c-direction. In a specific embodiment, the laser strip region has a first end and a second end. In a specific embodiment, the non-polar crystalline orientation is configured on an m-plane, which leads to polarization ratios parallel to the a-direction. In one or more embodiments, the m-plane is the (10-10) family. Of course, there cavity orientation can also be substantially parallel to the a-direction as well. In the specific non-polar GaN embodiment having the cavity orientation substantially parallel to the c-direction is further described in "Laser Device and Method Using Slightly Miscut Non-Polar GaN Substrates," in the names of Raring, James W. and Pfister, Nick listed as U.S. Provisional Ser. No. 61/168,926 filed Apr. 13, 2009, commonly assigned, and hereby incorporated by reference for all purposes.

In a preferred non-polar embodiment, the device has a first cleaved c-face facet provided on the first end of the laser stripe region and a second cleaved c-face facet provided on the second end of the laser stripe region. In one or more embodiments, the first cleaved c-facet is substantially parallel with the second cleaved c-facet. In a specific embodiment, the non-polar substrate is configured on (10-10) series of planes, which enables the formation of c-facets for laser cavities oriented in the c-direction. Mirror surfaces are formed on each of the cleaved surfaces. The first cleaved c-facet comprises a first mirror surface. In a preferred embodiment, the first mirror surface is provided by a scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titaniatantalum pentoxidezirconia, including combinations, and the like. Depending upon the embodiment, the first mirror surface can also comprise an anti-reflective coating. Of course, there can be other variations, modifications, and alternatives.

Also in a preferred non-polar embodiment, the second cleaved c-facet comprises a second mirror surface. The second mirror surface is provided by a scribing and breaking process according to a specific embodiment. Preferably, the scribing is diamond scribed or laser scribed or the like. In a specific embodiment, the second mirror surface comprises a reflective coating, such as silicon dioxide, hafnia, and titaniatantalum pentoxidezirconia, combinations, and the like. In a specific embodiment, the second mirror surface comprises an anti-reflective coating. Of course, there can be other variations, modifications, and alternatives.

In a specific embodiment, the laser stripe has a length and width. The length ranges from about 50 microns to about 3000 microns. The strip also has a width ranging from about 0.5 microns to about 50 microns, but can be other dimensions.

In a specific embodiment, the width is substantially constant in dimension, although there may be slight variations. The width and length are often formed using a masking and etching process, which are commonly used in the art. Further details of the present device can be found throughout the present specification and more particularly below In a specific non-polar embodiment, the device is also characterized by a spontaneously emitted light that is polarized parallel to the a-direction. That is, the device performs as a laser or the like. In a preferred embodiment, the spontaneously emitted light is characterized by a polarization ratio of greater than about 0.1 and less than about 1 parallel to the projection of the c-direction. Of course, there can be other variations, modifications, and alternatives. Further details of the laser device can be found throughout the present specification and more particularly below.

Figure 2:
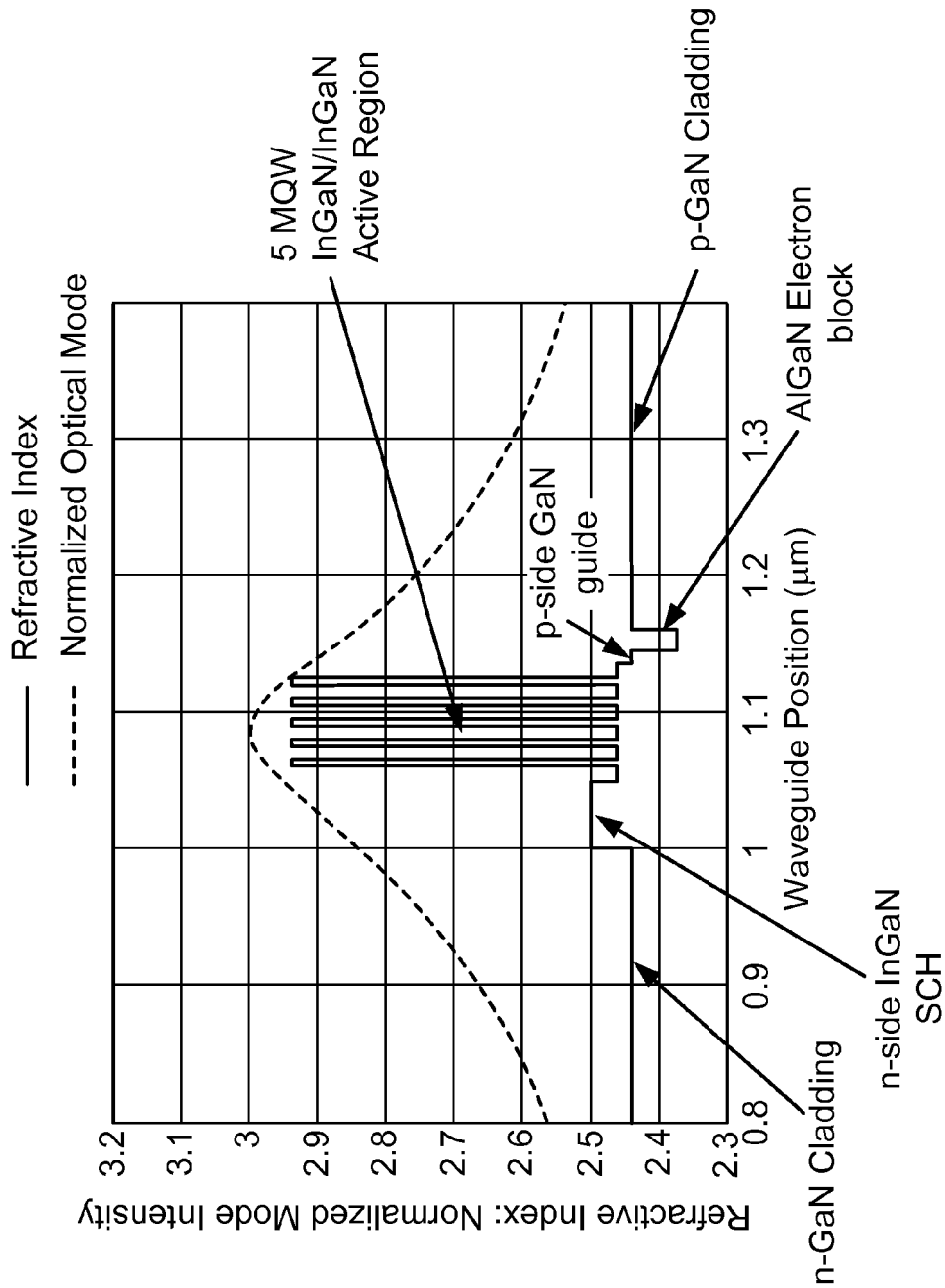
FIG. 2 is a detailed cross-sectional view of a laser device fabricated on a non-polar substrate according to an embodiment of the present invention.

FIG. 2 is a detailed cross-sectional view of a laser device 200 fabricated on a non-polar substrate according to an embodiment of the present invention. This diagram is merely an example, which should not unduly limit the scope of the claims herein. One of ordinary skill in the art would recognize other variations, modifications, and alternatives. As shown, the laser device includes gallium nitride substrate 203, which has an underlying n-type metal back contact region 201. In a specific embodiment, the metal back contact region is made of a suitable material such as those noted below and others. Further details of the contact region can be found throughout the present specification and more particularly below.

In a specific embodiment, the device also has an overlying n-type gallium nitride layer 205, an active region 207, and an overlying p-type gallium nitride layer structured as a laser stripe region 209. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where $0 \leq u, v, u+v \leq 1$, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE). Of course, there can be other variations, modifications, and alternatives.

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, is initiated.

In a specific embodiment, the laser stripe region is made of the p-type gallium nitride layer 209. In a specific embodiment, the laser stripe is provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes 213 contact region. In a specific embodiment, the dielectric region is an oxide such as silicon dioxide or silicon nitride, but can be others. The contact region is coupled to an overlying metal layer 215. The overlying metal layer is a multilayered structure containing gold and platinum (Pt/Au), but can be others. Of course, there can be other variations, modifications, and alternatives.

In a specific embodiment, the laser device has active region 207. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 1-20 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \leq w, x, y, z, w+x, y+z \leq 1$, where w<u, y and/or x>v, z so that the bandgap of the well layer(s) is less than that of the barrier layer(s) and the n-type layer. The well layers and barrier layers may each have a thickness between about 1 nm and about 40 nm. In another embodiment, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type. Of course, there can be other variations, modifications, and alternatives.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where $0 \leq s, t, s+t \leq 1$, with a higher bandgap than the active layer, and may be doped p-type. In one specific embodiment, the electron blocking layer comprises AlGaN. In another embodiment, the electron blocking layer comprises an AlGaN/GaN super-lattice structure, comprising alternating layers of AlGaN and GaN, each with a thickness between about 0.2 nm and about 5 nm. Of course, there can be other variations, modifications, and alternatives.

As noted, the p-type gallium nitride structure, which can be a p-type doped $Al_qIn_rGa_{1-q-r}N$, where $0 \leq q, r, q+r \leq 1$, layer is deposited above the active layer. The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes 213 contact region. In a specific embodiment, the dielectric region is an oxide such as silicon dioxide, but can be others. Of course, there can be other variations, modifications, and alternatives.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. Of course, there can be other variations, modifications, and alternatives.

EMBODIMENT

Figure 3A:
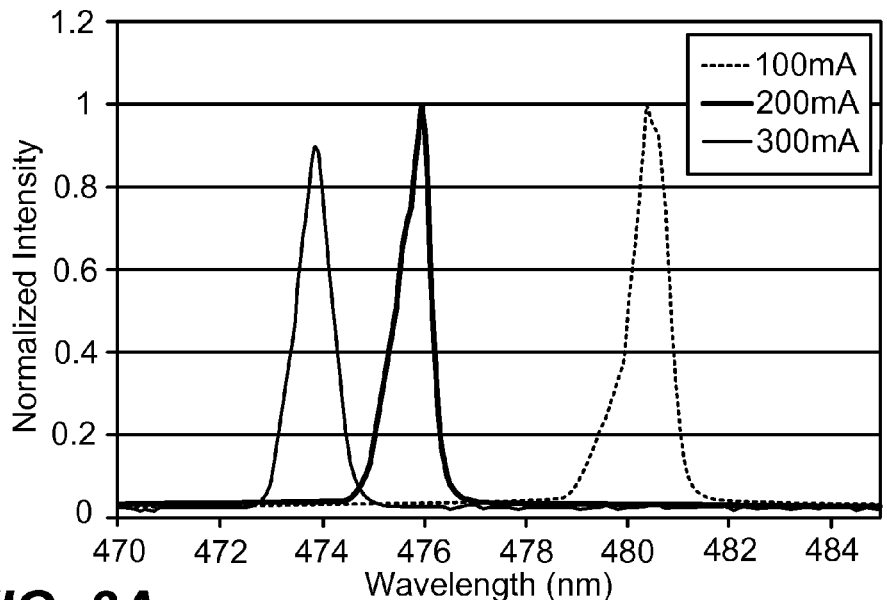
FIGS. 3A and 3B are simplified diagrams illustrating a laser device for a laser device according to an embodiment of the present invention.
Figure 3B:
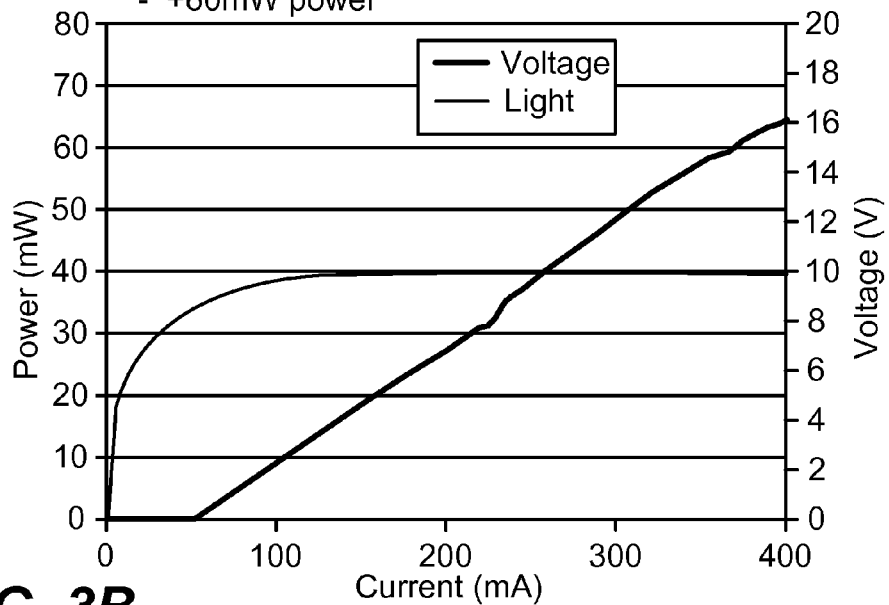

In a specific embodiment, the present invention provides an alternative device structure capable of emitting 481 nm light, among others, in a ridge laser embodiment. The device is provided with one or more of the following elements, as also referenced in FIGS. 3A and 3B.

n-GaN cladding layer with a thickness from 100 nm to 3000 nm with Si doping level of 5E17 to 3E18 cm-3 n-side SCH layer comprised of InGaN with molar fraction of indium of between 4% and 6% and thickness from 45 to 60 nm Multiple quantum well active region layers comprised of five 4.5-5.5 nm InGaN quantum wells separated by four 9.5-10.5 nm InGaN barriers with an indium molar fraction of between 1.5% and 3% p-side guide layer comprised of GaN with molar a thickness from 10 nm to 20 nm.

Electron blocking layer comprised of AlGaN with molar fraction of aluminum of between 15% and 22% and thickness from 10 nm to 15 nm and doped with Mg.

p-GaN cladding layer with a thickness from 400 nm to 1000 nm with Mg doping level of 5E17 cm-3 to 1E19 cm-3 p++-GaN contact layer with a thickness from 20 nm to 40 nm with Mg doping level of 1E20 cm-3 to 1E21 cm-3

In a specific embodiment, the laser device is fabricated on a non-polar oriented surface region (m-plane). In a preferred embodiment, the non-polar substrate has a miscut or offcut of −0.8 to −1.2 degrees towards (0001) and −0.3 to 0.3 degrees towards (11-20). In a specific embodiment, the non-polar oriented surface region has an overlying n-GaN/p-GaN grown with $H_2/N_2$ subflow and $H_2$ carrier gas. Of course, there can be other variations, modifications, and alternatives.

Although the above has been described in terms of a specific embodiment, other variations, modifications, and alternatives can exist. While the above is a full description of the specific embodiments, various modifications, alternative constructions and equivalents may be used. Therefore, the above description and illustrations should not be taken as limiting the scope of the present invention which is defined by the appended claims.

What is claimed is:

1. An optical device comprising:
a gallium nitride substrate having a non-polar crystalline surface region;
an n-type GaN cladding layer overlying the surface region, the n-type GaN cladding layer having a thickness from 100 nm to 3000 nm with a silicon doping level of 5E17 cm-3 to 3E18 cm-3;
an n-type SCH layer overlying the n-type GaN cladding layer, the n-type SCH layer comprised of InGaN with a molar fraction of indium of between 4% and 6% and having a thickness from 45 nm to 60 nm;
a multiple quantum well active region overlying the n-type SCH layer, the multiple quantum well active region comprised of five 4.5 nm-5.5 nm-thick InGaN quantum wells separated by four 9.5 nm-10.5 nm-thick InGaN barriers with an indium molar fraction of between 1.5% and 3%;
a p-type guide layer overlying the multiple quantum well active region, the p-type guide layer comprised of GaN with a thickness from 10 nm to 20 nm;
an electron blocking layer overlying the p-type guide layer, the electron blocking layer comprised of AlGaN with a molar fraction of aluminum of between 15% and 22% and having a thickness from 10 nm to 15 nm and doped with magnesium;
a p-type GaN cladding layer overlying the electron blocking layer, the p-type GaN cladding layer having a thickness from 400 nm to 1000 nm with a Mg doping level of 5E17 cm-3 to 1E19 cm-3; and
a p-type GaN contact layer overlying the p-type GaN cladding layer, the p-type GaN contact layer having a thickness from 20 nm to 40 nm with a magnesium doping level of 1E20 cm-3 to 1E21 cm-3.

* * * * *